(12) United States Patent
Jermann et al.

(10) Patent No.: US 7,481,951 B2
(45) Date of Patent: *Jan. 27, 2009

(54) LUMINESCENT POWDER, METHOD FOR PRODUCING THE LUMINESCENT POWDER AND LUMINESCENT BODY PROVIDED WITH LUMINESCENT POWDER

(75) Inventors: Frank Jermann, München (DE);
Markus Richter, Neutraubling (DE);
Wolfgang Rossner, Holzkirchen (DE);
Martin Zachau, Geltendorf (DE)

(73) Assignees: Osram Opto Semiconductors GmbH, Regensburg (DE);
Patent-Treuhand-Gesellschaft für elektrische Glühlampen mbH, Munich (DE)

( * ) Notice: Subject to any disclaimer, the term of this patent is extended or adjusted under 35 U.S.C. 154(b) by 308 days.

This patent is subject to a terminal disclaimer.

(21) Appl. No.: 10/513,724

(22) PCT Filed: May 28, 2003

(86) PCT No.: PCT/DE03/01749

§ 371 (c)(1),
(2), (4) Date: Jun. 30, 2005

(87) PCT Pub. No.: WO03/102113

PCT Pub. Date: Dec. 11, 2003

(65) Prior Publication Data

US 2006/0022580 A1     Feb. 2, 2006

(30) Foreign Application Priority Data

May 29, 2002  (DE) ............................... 102 23 988

(51) Int. Cl.
*C09K 11/80* (2006.01)

(52) U.S. Cl. .................. 252/301.4 R; 252/301.4 F; 252/301.6 R; 252/301.6 F

(58) Field of Classification Search  252/301.4 R–301.6 F; 313/503; 257/98
See application file for complete search history.

(56) References Cited

U.S. PATENT DOCUMENTS 4,034,257 A * 7/1977 Hoffman ..................... 313/487

(Continued)

FOREIGN PATENT DOCUMENTS

DE      27 39 437        3/1978

(Continued)

OTHER PUBLICATIONS

I. Matsubara et al., "Preparation of Cr-doped $Y_3Al_5O_{12}$ phosphors by heterogeneous precipitation methods and their luminescent properties", Materials Research Bulletin, vol. 35, pp. 217-224, 2000.

*Primary Examiner*—C. Melissa Koslow
(74) *Attorney, Agent, or Firm*—Cohen Pontani Lieberman & Pavane LLP

(57) ABSTRACT

A luminescent powder (1) with luminescent particles (2) having an average luminescent-particle size (3) selected from the range of from 0.1 μm inclusive to 5.0 μm inclusive. The luminescent particles comprise primary particles (4) having an average primary-particle size (5) selected from the range of from 0.1 μm inclusive to 1.0 μm inclusive. The primary particles which, for example, consist of a cerium-doped yttrium-aluminum garnet ($Y_3Al_5O_{12}$), are agglomerated to form the luminescent particles. A method for producing the luminescent powder has the following steps: a) preparing at least one precursor of the primary particles, b) producing the primary particles from the precursor of the primary particles, and c) forming the luminescent particles of the luminescent powder from the primary particles. The precursor for $Y_3Al_5O_{12}$ is, for example, a powder mixture of hydroxides. In order to prepare the precursor, the hydroxides are precipitated from a sulfuric-acid solution containing metal by dropwise addition of a basic ammonia solution. The precipitate is dried and subsequently calcined, so that the primary particles are formed and simultaneously cluster together to form the luminescent particles of the luminescent powder.

18 Claims, 5 Drawing Sheets

U.S. PATENT DOCUMENTS

| | | |
|---|---|---|
| 4,180,477 A | 12/1979 | Barnes |
| 4,314,910 A * | 2/1982 | Barnes ................. 252/301.4 R |
| 4,350,559 A | 9/1982 | Boudot et al. |
| 5,314,641 A * | 5/1994 | Collin et al. .......... 252/301.4 P |
| 6,180,029 B1 * | 1/2001 | Hampden-Smith et al. .................... 252/301.4 R |
| 6,596,196 B2 * | 7/2003 | Huguenin et al. ..... 252/301.4 R |
| 7,126,265 B2 * | 10/2006 | Jermann et al. ............. 313/485 |
| 2001/0030368 A1 * | 10/2001 | Tasaka ...................... 257/758 |
| 2002/0088963 A1 | 7/2002 | Ono et al. |

FOREIGN PATENT DOCUMENTS

| | | |
|---|---|---|
| DE | 29 37 428 | 4/1980 |
| EP | 0 353 926 B1 | 7/1989 |
| EP | 1 217 057 A2 | 6/2002 |
| JP | 2001270775 | 2/2001 |
| JP | 2002029742 | 1/2002 |

* cited by examiner

LUMINESCENT POWDER, METHOD FOR PRODUCING THE LUMINESCENT POWDER AND LUMINESCENT BODY PROVIDED WITH LUMINESCENT POWDER

This is a U.S. national stage of International Application No. PCT/DE03/01749, filed on 28 May 2003.

1. Field of the Invention

The invention relates to a luminescent powder, which comprises luminescent particles having an average luminescent-particle size selected from the range of from 0.1 µm inclusive to 5.0 µm inclusive. A method for producing the luminescent powder, and a luminescent body comprising the luminescent powder, are also provided.

2 Prior Art

Such a luminescent powder and a method for its production are known from I. Matsubara et al., Materials Research Bulletin 35 (2000), pages 217-224. The luminescent particles have an average luminescent-particle size of at least 1 µm. The luminescent particles consist of a chromium-doped yttrium-aluminum garnet ($Y_3Al_5O_{12}$). Chromium is contained, for example, at 0.5 mol %. Chromium in this case constitutes an optically active component of the garnet. Chromium absorbs stimulation light and, after stimulation, emits emission light (luminescence). The chromium contained in the garnet may also be stimulated to luminesce with the aid of electrons. For example, the known luminescent powder is used in a phosphor screen (luminescent body) of a cathode ray tube.

The production of the known luminescent substance is carried out with the aid of so-called heterogeneous precipitation. To this end, aluminum sulfate ($Al_2(SO_4)_3$) and urea are dissolved in distilled water. The solution is stirred continuously for a period of two hours at a temperature of 80-90° C.

A precipitate of aluminum hydroxide ($Al(OH)_3$) is thereby formed. The precipitate which is obtained is washed in distilled water and isopropanol and dried for one day at a temperature of 120° C. The aluminum hydroxide is suspended in distilled water. In order to avoid agglomeration of the aluminum hydroxide powder, vigorous stirring is carried out and urea is added. Stoichiometric amounts of yttrium sulfate ($Y_2(SO_4)_3$) and chromium sulfate ($Cr_2(SO_4)_3$) are also dissolved in distilled water. The suspensions and the solution are subsequently mixed together and heated to 80-90° C. for one hour. The precipitate obtained in this way is washed in distilled water and isopropanol, centrifuged and dried overnight at 120° C. The powder which is obtained is subsequently calcined for two hours at 900° C.-1700° C. in the presence of air. A chromium-doped yttrium-aluminum garnet is obtained, which has a relatively high luminescent efficiency.

Since the luminescent powder produced by this method consists of luminescent particles each having a layer, a few tenths of a micrometer thick, which does not contribute to the luminescence (dead layer), the luminescent particles must have an average luminescent-particle size of at least 1 µm to achieve the high luminescent efficiency. A typical diameter of the luminescent particles is on average 1 µm. However, this means that the production parameters of the method must be set very accurately in order for the resulting luminescent powder to have the high luminescent efficiency.

Other methods for the production of such luminescent powders are described in EP-A 353 926, DE-A 27 39 437, DE-A 29 37 428, U.S. Pat. Nos. 4,180,477 and 4,350,559.

SUMMARY OF THE INVENTION

It is therefore an object of the present invention to provide a luminescent powder having a high luminescent efficiency, and a simple and efficient method for its production. It is another object, in particular, to provide a highly efficient LED which uses the luminescent powder for conversion of the primary radiation.

In order to achieve the first object, a luminescent powder is provided which comprises luminescent particles having an average luminescent-particle size selected from the range of from 0.1 µm inclusive to 5.0 µm inclusive. The luminescent powder is characterized in that the luminescent particles comprise primary particles having an average primary-particle size selected from the range of from 0.1 µm inclusive to 1.5 µm inclusive. In particular, a preferred value for the lower limit is 0.2 µm, particularly preferably 0.5 µm, for the average luminescent-particle size. A preferred value for the upper limit is 1.0 µm.

In order to achieve the second object, a method for producing the luminescent powder is provided, which has the following steps:

a) preparing at least one precursor of the primary particles,
b) producing the primary particles from the precursor of the primary particles, and
c) forming the luminescent particles of the luminescent powder from the primary particles.

A luminescent body is furthermore provided, which comprises such a luminescent powder for converting stimulation light into emission light. The emission light, which is referred to as luminescence, may comprise both fluorescence and phosphorescence. The luminescent body may in this case consist only of the luminescent powder. It is also conceivable for the luminescent powder to be contained in a matrix of the luminescent body, which is transparent to the stimulation light and the emission light. The luminescent power may likewise be applied as a layer on the luminescent body. The luminescent body is, for example, an LED (light emitting diode) converter or a phosphor screen of a cathode ray tube, as mentioned in the introduction.

It has been found that a luminescent powder having a very high luminescent efficiency is obtained if the luminescent particles are formed by small primary particles which contribute to the luminescence. In one embodiment the primary particles are separate, and in another embodiment they are the joined solidly together as an aggregate (secondary particles). Both forms can sometimes give rise to agglomerates. In contrast to the known prior art, if the primary-particle diameter is selected carefully, the problem does not arise that the luminescent particles have a more or less thick dead layer, which does not contribute to the luminescent efficiency. Even the individual primary particles have virtually no dead layer.

The luminescent particles preferably have a spherical (ball) shape.

In one particular configuration, the luminescent particles consist essentially, in particular at least 80%, only of the primary particles. This means that substantially no other particles different to the primary particles are present.

The primary particles contribute to the luminescent efficiency of the luminescent powder according to their composition. The primary particles may in this case have compositions that differ from one another.

In particular, the primary particles can now form essentially a single phase. This means that the primary particles consistently have a particularly desired composition with the same (photo-) physical properties.

For example, in contrast to the feature of this refinement of the invention, the binary system aluminum oxide-yttrium oxide ($Al_2O_3$—$Y_2O_3$) may contain other phases besides the photo-physically active phase yttrium-aluminum garnet, which do not contribute to the luminescent efficiency and which are in fact undesired. Such phases have, for example, the compositions $YAlO_3$ or $Al_2Y_4O_9$. The primary particles preferably comprise a garnet. The garnet has, in particular, a composition $A_3B_5O_{12}$, A and B being trivalent metals. The garnet is preferably an yttrium-aluminum garnet having the composition $Y_3Al_5O_{12}$.

The garnet obtains its luminescent property owing to the fact that the garnet is doped. In particular, the primary particles are therefore doped with at least one rare earth metal. The rare earth metal is, in particular, selected from the group cerium and/or gadolinium (Gd) and/or lanthanum (La) and/or terbium (Tb) and/or praseodymium (Pr) and/or europium (Eu). Pr and Eu are also suitable in particular for co-doping, for example together with Ce. Further doping, for example transition-metal doping with chromium (Cr), or mixtures of different types of doping, are likewise conceivable.

In another particular configuration, the luminescent particles have pores with an average pore size selected from the range of from 0.1 μm inclusive to 1.0 μm inclusive. In particular, the average pore size is approximately 0.5 μm. This leads, in particular, to a luminescent-particle density of the luminescent particles which is selected from the range of from 40% inclusive to 70% inclusive, with respect to a theoretical density.

A preferred production method will be described below. For the production method, the precursor is selected in particular from the group metal hydroxide and/or metal oxide. In the case of yttrium-aluminum garnet, for example, aluminum hydroxide and yttrium oxide are used.

In particular, chemical precipitation of the precursor from a metal salt solution of the metal salt is carried out in order to prepare the precursor.

The metal salt is preferably selected from the group metal halide or metal sulfate. The metal halide is, for example, a metal chloride. Preferably, an acidic metal salt solution is used, and a basic precipitation reagent is used for the precipitation. In order to produce the fine primary particles, in particular, the basic precipitation reagent is added dropwise to the acidic metal salt solution, or the acidic metal salt solution is added dropwise to the basic precipitation reagent. In particular, a sulfuric-acid metal salt solution is used as the acidic metal salt solution. An ammonia solution, in particular, is used as the basic precipitation reagent in this case. This is intended to mean a solution in which ammonia is directly dissolved in the solvent, for example water. It is, however, also conceivable for a precursor of ammonia to be dissolved in the solvent so as to release ammonia. The precursor is, for example, urea. Ammonia is released by heating the urea.

In another configuration, ageing of the precursor, after the precipitation of the precursor, is carried out in order to prepare the precursor. The ageing leads to increased crystal growth of the primary particles, or to increased aggregation of the primary particles to form the luminescent particles.

The ageing takes place, in particular, at a pH of from 5.5 inclusive to 6.5 inclusive. The ageing is carried out, in particular, at an ageing temperature which is selected from the range of from 20° C. inclusive to 90° C. inclusive.

In particular, calcination is carried out in order to produce the primary particles and/or in order to form the luminescent particles. The calcination can lead to increased aggregation between the primary particles. Preferably, the calcination is carried out at a calcination temperature which is selected from the range of from 1200° C. inclusive to 1700° C. inclusive. In particular, the calcination temperature is up to 1500° C.

The calcination may be followed by further processing steps. For example, the (raw) luminescent particles which are obtained are also ground.

BRIEF DESCRIPTION OF THE DRAWINGS

The invention will be described in more detail below with the aid of an exemplary embodiment and the associated figures. The figures are schematic and do not constitute true-to-scale representations.

PREFERRED EMBODIMENTS OF THE INVENTION

Figure 1:
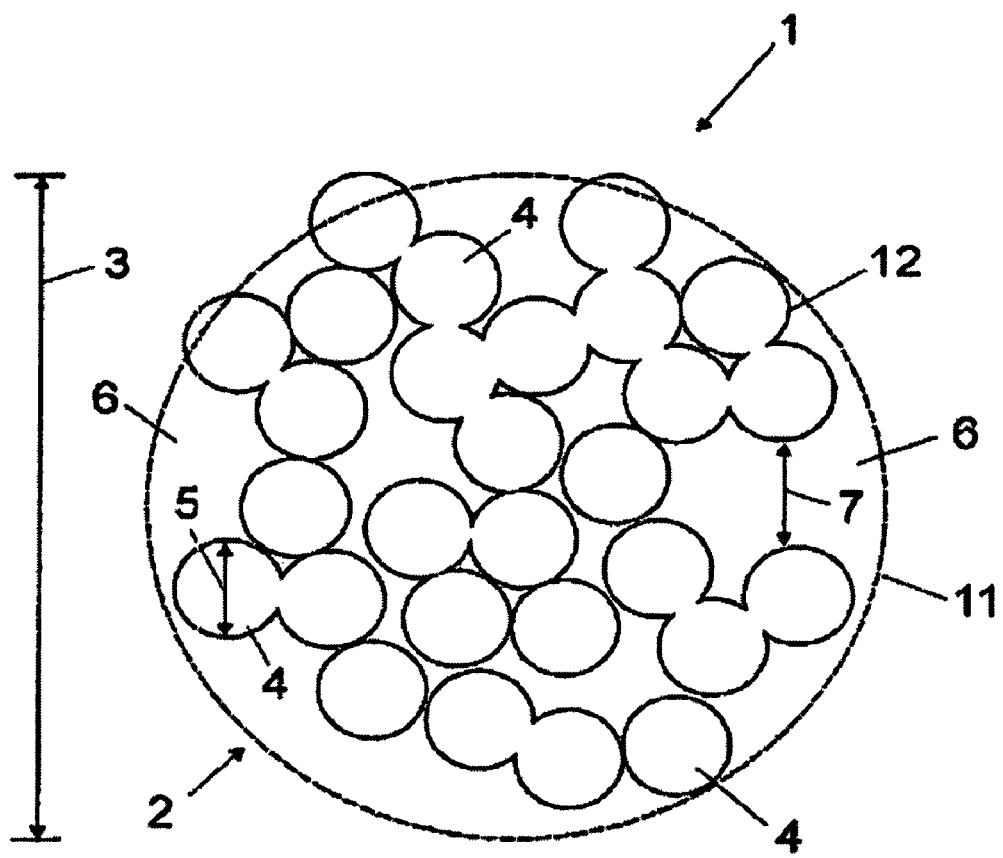
FIG. 1 schematically shows a luminescent particle, which consists of a multiplicity of primary particles.
Figure 2A:
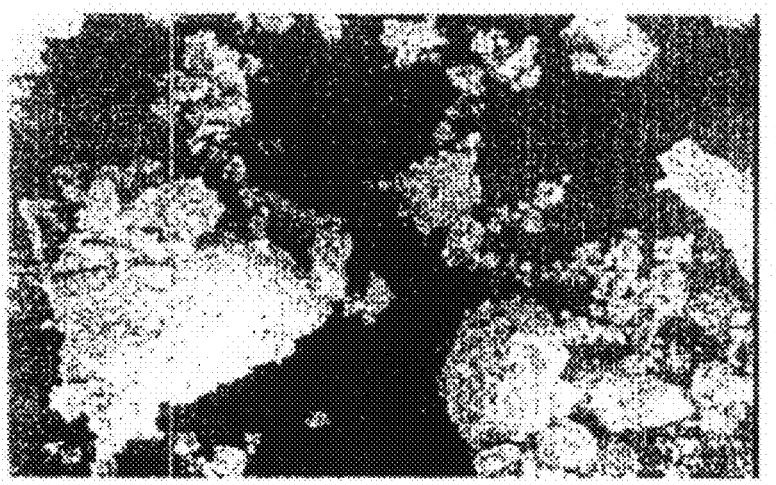
FIGS. 2a to 2c respectively show an SEM image of a luminescent powder.
Figure 2B:
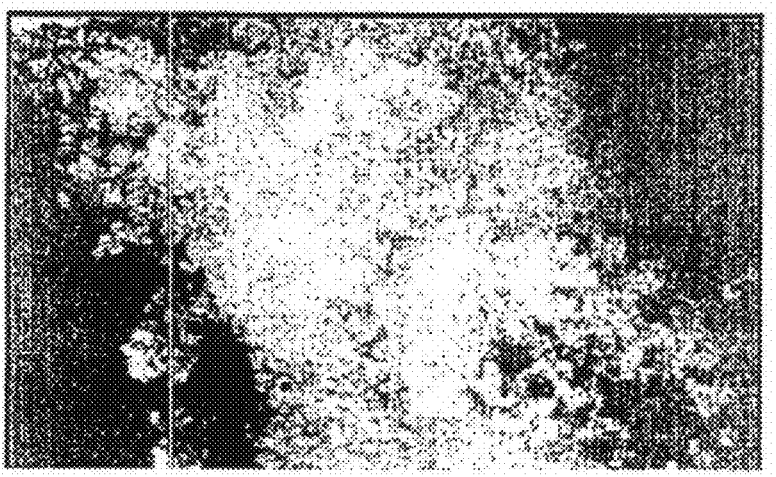
Figure 2C:
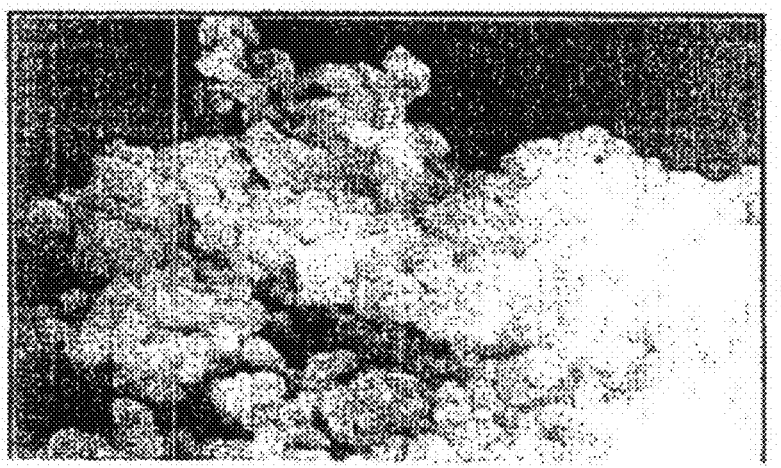

The luminescent powder 1 consists of a multiplicity of luminescent particles 2 (FIGS. 1 and 2). The luminescent particles 2 have a spherical, or at least essentially spherical shape 11. In particular, any arbitrarily oriented diameter differs by no more than 30% from the maximum diameter, see FIG. 1. The average luminescent-particle diameter 3 of the luminescent particles is approximately 3 μm. The individual luminescent particles 2 each consist of an aggregate or agglomerate 12 of a multiplicity of primary particles 4. The primary particles in this case have an average primary-particle diameter 5 of approximately 0.5 μm. The luminescent particles 2 essentially consist only of the primary particles 4. Furthermore, the luminescent particles 2 have pores 6 with an average pore size 7 of approximately 0.5 μm. The pores 6 are open.

Said particle diameters are to be understood, for example in the case of the primary particles or somewhat smaller diameters, as equivalent diameters obtained by means of optically or electron-microscopically (for example SEM) recorded particle images and, in the case of the luminescent particles or somewhat larger diameters, as equivalent diameters from laser diffraction measurements. To a good approximation, it may be assumed that the two different methods for recording equivalent diameters provide similar to identical results on a given sample, if the powder samples are prepared optimally for the measurement.

The primary particles 4 consist of an yttrium-aluminum garnet having the composition $Y_3Al_5O_{12}$. The primary particles 4 are doped with the rare earth metal cerium. Cerium is contained at 0.5 mol %. The primary particles 4 form a single phase having said composition.

Figure 4:
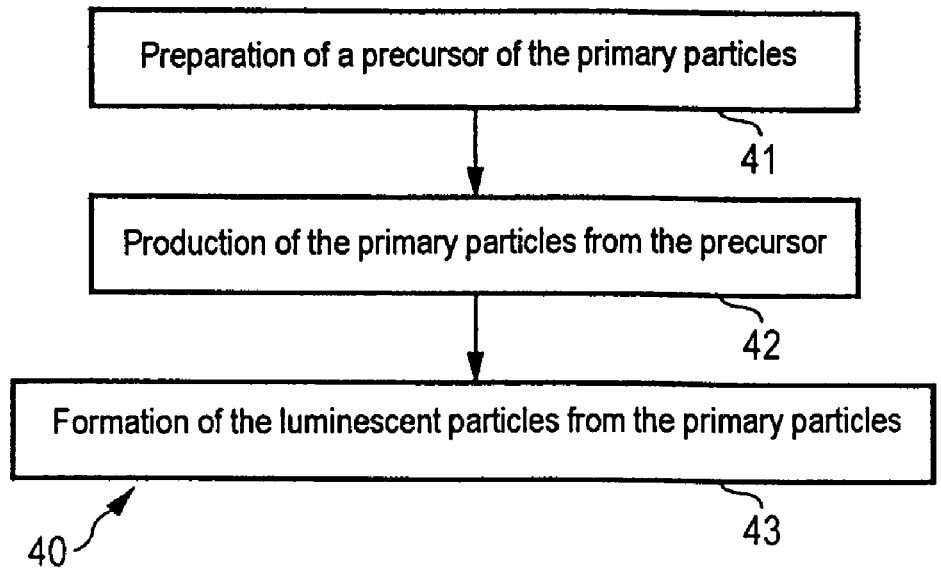
FIG. 4 shows a method for producing the luminescent powder.
Figure 5:
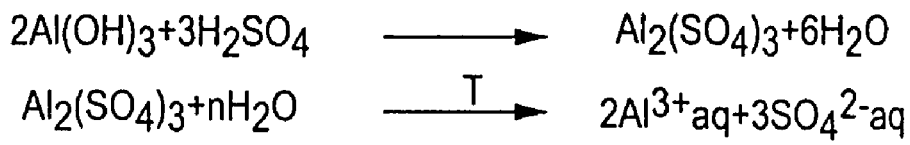
FIG. 5 shows the reaction equations on which the method based.
Figure 5:
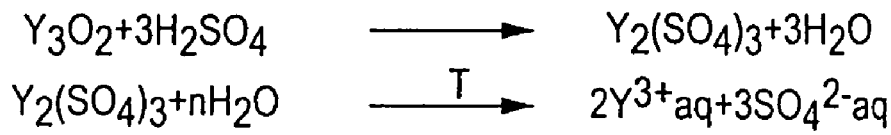
Figure 5:
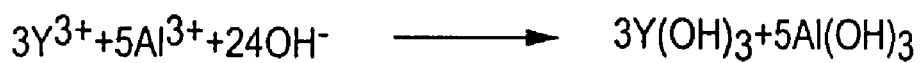
Figure 5:

According to the method for producing the luminescent powder 1 (FIG. 4, 40), a precursor of the primary particles is firstly prepared (FIG. 4, 41). The precursor consists of a powder mixture of aluminum hydroxide (Al(OH)$_3$) and yttrium hydroxide (Y(OH)$_3$). To this end, aluminum hydroxide and yttrium oxide are dissolved separately from one another in concentrated sulfuric acid (FIG. 5, 51 and 52). The temperature is increased in order to accelerate the dissolving. The two sulfuric-acid metal salt solutions which are obtained are filtered. The concentrations of aluminum and yttrium are respectively determined. The solutions are subsequently mixed together according to the required stoichiometric measurements. Precipitation of the corresponding hydroxide is then carried out with a basic ammonia solution (FIG. 5, 53). The ammonia solution consists of ammonia (NH$_3$) dissolved in distilled water. For the precipitation, the ammonia solution is added dropwise to the sulfuric-acid solution of the metal salts. The precipitate which is obtained in this way is washed with cold (10° C.) distilled water. Since a certain amount of the aluminum will be washed away by the water, it is necessary to ensure that the aluminum is added in excess when the sulfuric-acid metal salt solutions are being mixed. The precipitate is filtered and dried for 10 hours at 150° C. Calcination of the precipitate is subsequently carried out in the presence of forming gas, which consists of 95 vol % nitrogen (N$_2$) and 5 vol % hydrogen (H$_2$) (FIG. 5, 54). The calcination takes place at 1200° C. for a period of about two hours. The primary particles are formed from the precursor during the calcination (FIG. 4, 42). At the same time, the luminescent particles of the luminescent powder are formed by agglomeration of the primary particles (FIG. 4, 43). A luminescent powder having a high luminescent efficiency is obtained.

Figure 3A:
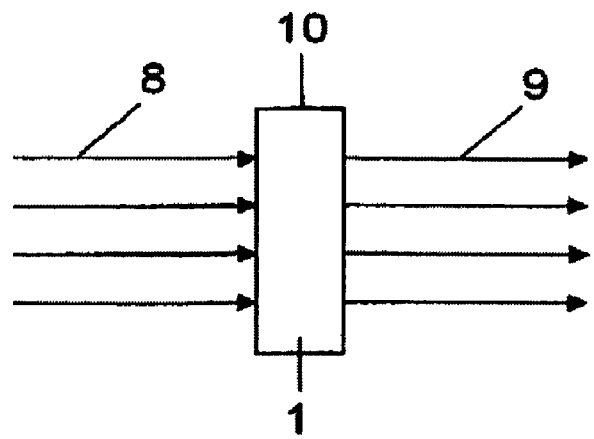
FIG. 3 shows a luminescent body comprising the luminescent powder (FIG. 3a) and, specifically, an LED (FIG. 3b) having an arrangement of this type.

The luminescent powder 1 is used in a luminescent body 10 (FIG. 3a in schematic representation). "Luminescent body 10" means first and foremost a device containing the luminescent substance, for example a conversion LED. Such LEDs are known by the name LUKOLED. With the aid of the luminescent powder 1, some or all of the stimulation light 8, i.e. light (or short-wave radiation) which is emitted in primary form by a chip, is converted into emission light (luminescence) 9. This luminescence is often also referred to as secondary emission.

Figure 3B:
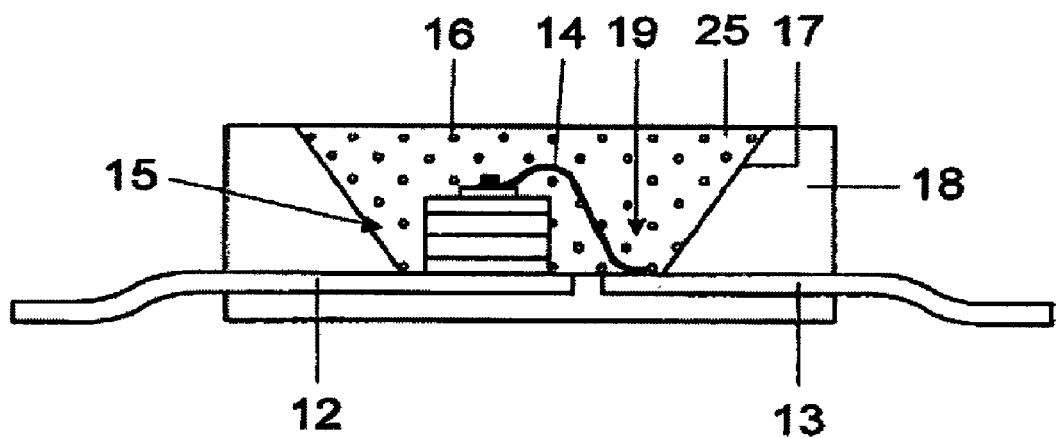

A specific example of the luminescent body involves the luminescent powder being used in a white-light or colored LED, together with an InGaN chip. The exemplary structure of such a light source is shown explicitly in FIG. 3b. The light source is a semiconductor component (chip 1) of the InGaN type with a peak emission wavelength of 460 nm (blue), which has a first electrical terminal 12 and a second electrical terminal 13 and is embedded in the vicinity of a recess 19 in an optically opaque base package 18. One of the terminals 13 is connected to the chip 15 by a bonding wire 14. The recess has a wall 17, which is used as a reflector for the blue primary radiation of the chip 15. The recess 19 is filled with a potting compound 25, which contains a silicone casting resin (or epoxy casting resin) (80 to 90% by weight) and luminescent pigments 16 (less than 15% by weight) as its main constituents.

Further small proportions are made up, inter alia, of methyl ether and Aerosil. The luminescent pigments are yellow-emitting YAG:Ce according to the present invention, or a mixture of two (or more) pigments that emit green and red light. An example of a suitable green-emitting luminescent substance is a Ce-doped yttrium garnet which, in addition to Al, also contains proportions of Ga and/or Sc at the lattice site of the aluminum. An example of a red-emitting luminescent substance is a nitride containing Eu. In both cases, the secondary light of the luminescent substance is mixed with the primary light of the chip to form white light. A colored LED is obtained, for example, by using a YAG:Eu as the luminescent substance for stimulation by a UV-emitting chip.

Surprisingly, it has been found that particular advantages can be obtained in conversion LEDs by particularly careful selection of the particle size $d_{50}$ of the luminescent substance. A high efficiency can be observed, in particular, in the range of average particle size $d_{50}$ between 0.2 and 1.0 μm. Maximally high scattering is deliberately accepted in this case, unlike in previous proposals, while the absorption:scattering ratio is increased at the same time. Ideally, the choice of $d_{50}$ is close to the maximum scattering in respect of the incident primary radiation. In practice, even differences of up to 20% have been found to be advantageous. Differences of up to 50% often still provide satisfactory results. In principle, an LED exhibiting high absorption by the luminescent substance placed in front of the primary radiation source can be achieved in this way.

Figure 6A:
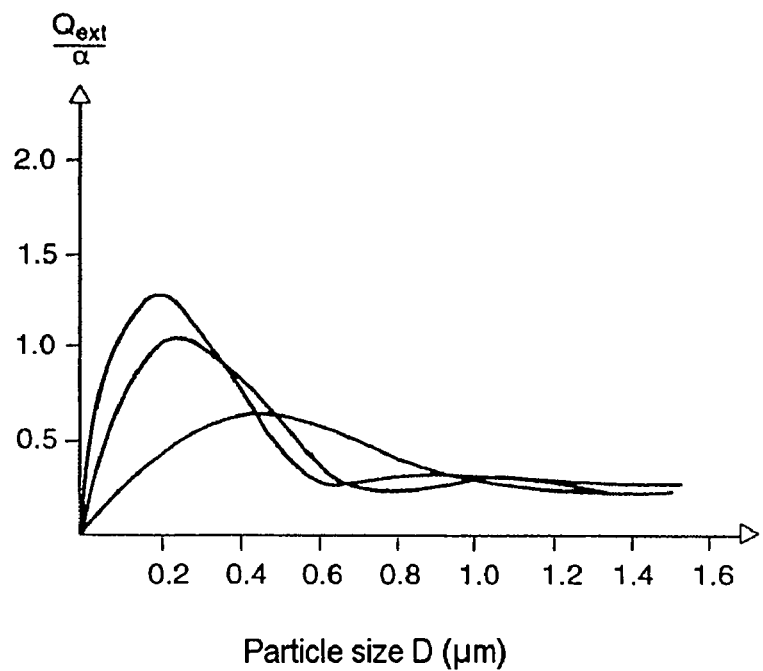
FIGS. 6A and 6B are graphs showing the scattering behavior of particles as a function of their diameter for several luminescent substances.

FIG. 6a shows, by way of example, that the scattering increases toward smaller particle diameters below 1 μm for many luminescent substances. It can typically be increased by up to a factor of 5. This allows perfect homogenization of the radiation emitted overall, which is particularly important especially for mixed-light LEDs. This means that the primary radiation of the LED is not fully converted, but itself still contributes directly to the radiation actually being used. One specific example is a chip emitting blue primary light, which is used together with a yellow-emitting luminescent substance. The two types of radiation then come from different regions of space. In order to suppress this impression, it was in fact previously necessary to add separately scattering filler particles to the encapsulation, which on the one hand is expensive and, on the other hand, reduces the efficiency somewhat. In particular, this structure is important when more than one luminescent substance is being used for the partial conversion, i.e. in a system with blue primary radiation, for example, which is converted partially by a green luminescent substance and partially by a red luminescent substance, in the capacity of a white-light LED based on the RGB mixing principle. Typical maximum scatterings occur at from 0.2 to 0.5 μm. In this case, the scattering intensity is increased by a typical factor of from 2 to 5 compared with a value at 1.5 μm, the value of which scarcely changes further toward high diameters (2 to 5 μm).

Figure 6B:
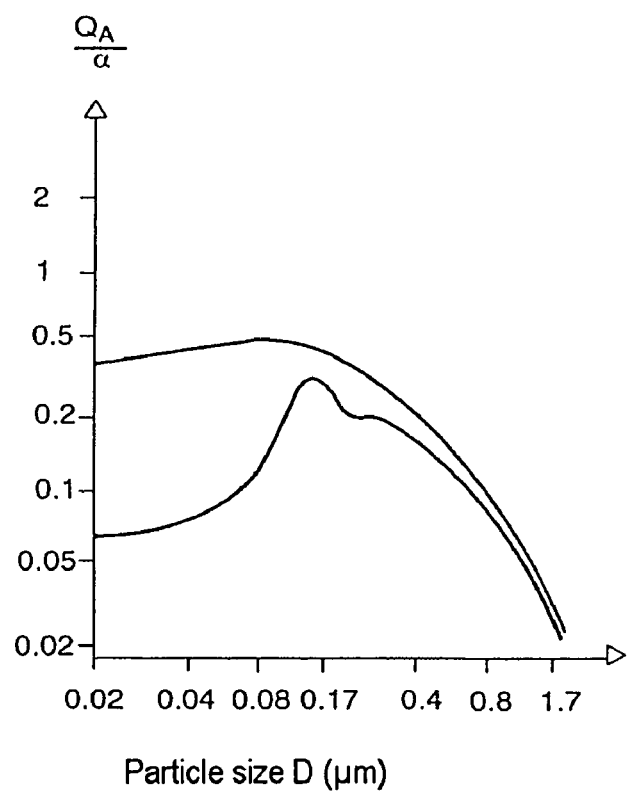

FIG. 6b shows, by way of example, that the absorption increases toward smaller particle diameters D, and passes through a more or less pronounced maximum at approximately 0.1 to 0.3 μm. The absorption is here sometimes more than 5 times greater than at approximately 2 μm, and at least two times as great as at 1 μm. If the particle size is selected in this range, the absorption:scattering ratio increases continuously toward smaller particle diameters from 2 μm down to 0.2 μm. This entails a reduction in the scattering loss and an increased efficiency. Although the increased scattering must sometimes be accepted in this case, a highly efficient LED with a homogeneous emission performance is nevertheless obtained. The higher scattering leads to a better and more homogeneous blue/yellow indicatrix.

The invention claimed is:

1. A luminescent powder, comprising:
    luminescent particles having an average luminescent-particle size selected from a range of 0.1 μm to 5.0 μm inclusive;
    wherein the luminescent particles comprise at least 80% primary particles having an average primary-particle size selected from a range of 0.1 μm to 1.0 μm inclusive;

the primary particles are garnets;

the luminescent particles are in essentially spherical shape; and the luminescent particles have pores with an average pore size selected from a range of 0.1 μm to 1.0 μm inclusive.

2. The luminescent powder as claimed in claim 1, wherein the luminescent particles have a spherical shape.

3. The luminescent powder as claimed in claim 1, wherein the primary particles essentially form a single phase.

4. The luminescent powder as claimed in claim 1 wherein the garnets have a composition $A_3B_5O_{12}$, A and B being trivalent metals.

5. The luminescent powder as claimed in claim 4, wherein the composition is $Y_3Al_5O_{12}$.

6. The luminescent powder as claimed in claim 1, wherein the primary particles are doped with at least one rare earth metal.

7. The luminescent powder as claimed in claim 6, wherein the rare earth metal is selected from the group consisting of cerium, Gd, La, Th, Pr, and Eu, and combinations thereof.

8. The luminescent powder as claimed in claim 1, wherein the average pore size is approximately 0.5 μm.

9. A luminescent powder, comprising:

luminescent particles having an average luminescent-particle size selected from a range of 0.1 μm to 5.0 μm inclusive;

wherein the luminescent particles comprise at least 80% primary particles having an average primary-particle size selected from a range of 0.1 μm to 1.0 μm inclusive;

the primary particles are garnets;

the luminescent particles are in essentially spherical shape; and the luminescent particles have a luminescent-particle density selected from a range of 40% to 70% inclusive, with respect to a theoretical density.

10. A method for producing a luminescent powder as claimed in claim 1, comprising the steps:

a) co-precipitating precursors composed of oxides and/or hydroxides;

b) ageing the precursors after the step of co-precipitating; and c) calcining the precursors to form the luminescent powder of claim 1;

wherein the co-precipitating is chemical precipitation from a metal salt solution.

11. The method as claimed in claim 10, wherein the metal salt is selected from the group consisting of metal halide, metal sulfate, and combination thereof.

12. The method as claimed in claim 10, wherein the metal salt solution is an acidic metal salt solution, and a basic precipitation reagent is used for the precipitation.

13. The method as claimed in claim 12, wherein the basic precipitation reagent is added dropwise to the acidic metal salt solution, or the acidic metal salt solution is added dropwise to the basic precipitation reagent.

14. A method for producing a luminescent powder as claimed in claim 1, comprising the steps:

a) co-precipitating precursors composed of oxides and/or hydroxides; and b) calcining the co-precipitated precursors of step a) to form the luminescent powder of claim 1;

wherein the co-precipitating is chemical precipitation from a sulfuric-acid metal salt solution, and a basic precipitation reagent is used for the precipitation.

15. The method as claimed in claim 14, wherein an ammonia solution is used as the basic precipitation reagent.

16. The method as claimed in claim 10, wherein the ageing is carried out at a pH in a range of 5.5 to 6.5 inclusive.

17. The method as claimed in claim 10, wherein the ageing is carried out at an ageing temperature in a range of 20° C. to 90° C. inclusive.

18. The method as claimed in claim 10, wherein the calcination is carried out at a calcination temperature in a range of 1200° C. to 1700° C. inclusive.

* * * * *